United States Patent
Leizerovich et al.

[11] Patent Number: 5,933,767
[45] Date of Patent: Aug. 3, 1999

[54] APPARATUS AND METHOD FOR TUNING THE GAIN OF A TRANSMITTER UTILIZING CARTESIAN FEEDBACK

[75] Inventors: Gustavo D. Leizerovich, Miami Lakes; David H. Minasi, Plantation; Geroncio O. Tan, Sunrise, all of Fla.

[73] Assignee: Motorola, Inc., Schaumburg, Ill.

[21] Appl. No.: 08/929,523

[22] Filed: Sep. 15, 1997

[51] Int. Cl.[6] ............................... H03F 1/32; H04B 1/04
[52] U.S. Cl. ........................................ 455/126; 455/127
[58] Field of Search ................................. 455/126, 127; 330/278, 291, 84

[56] References Cited

U.S. PATENT DOCUMENTS

| | | | |
|---|---|---|---|
| 4,626,803 | 12/1986 | Holm | 332/9 R |
| 5,420,536 | 5/1995 | Faulkner | 330/149 |
| 5,469,105 | 11/1995 | Sparks | 330/129 |
| 5,507,017 | 4/1996 | Whitmarsh et al. | 455/126 |
| 5,613,226 | 3/1997 | Kanami | 455/126 |
| 5,793,817 | 10/1996 | Wilson | 375/297 |
| 5,802,451 | 8/1996 | Adachi et al. | 455/126 |
| 5,880,633 | 5/1997 | Leizerovich et al. | 330/84 |

OTHER PUBLICATIONS

"Transmitter Linearization Using Cartesian Feedback for Linear TDMA Modulation" by Mats Johansson and Thomas Mattsson, 1991 IEEE pp. 439–444.

*Primary Examiner*—Reinhard J. Eisenzopf
*Assistant Examiner*—Duc Nguyen
*Attorney, Agent, or Firm*—Scott M. Garrett

[57] ABSTRACT

A transmitter has a loop switch (132) and a feedback switch (127), which are operated by a control circuit (134). An unamplified value is obtained by connecting a cartesian demodulator (126) with the input to a power amplifier (118), applying a fixed baseband signal level to the input of the cartesian modulator, and measuring the output level of the cartesian demodulator. An amplified value is obtained by connecting the output of the power amplifier to the cartesian demodulator, again applying a fixed baseband signal level, and measuring the output of the demodulator. The amplified and unamplified values are compared by the control circuit, and the power amplifier gain is adjusted by varying the gain adjust signal (138), if necessary.

9 Claims, 1 Drawing Sheet

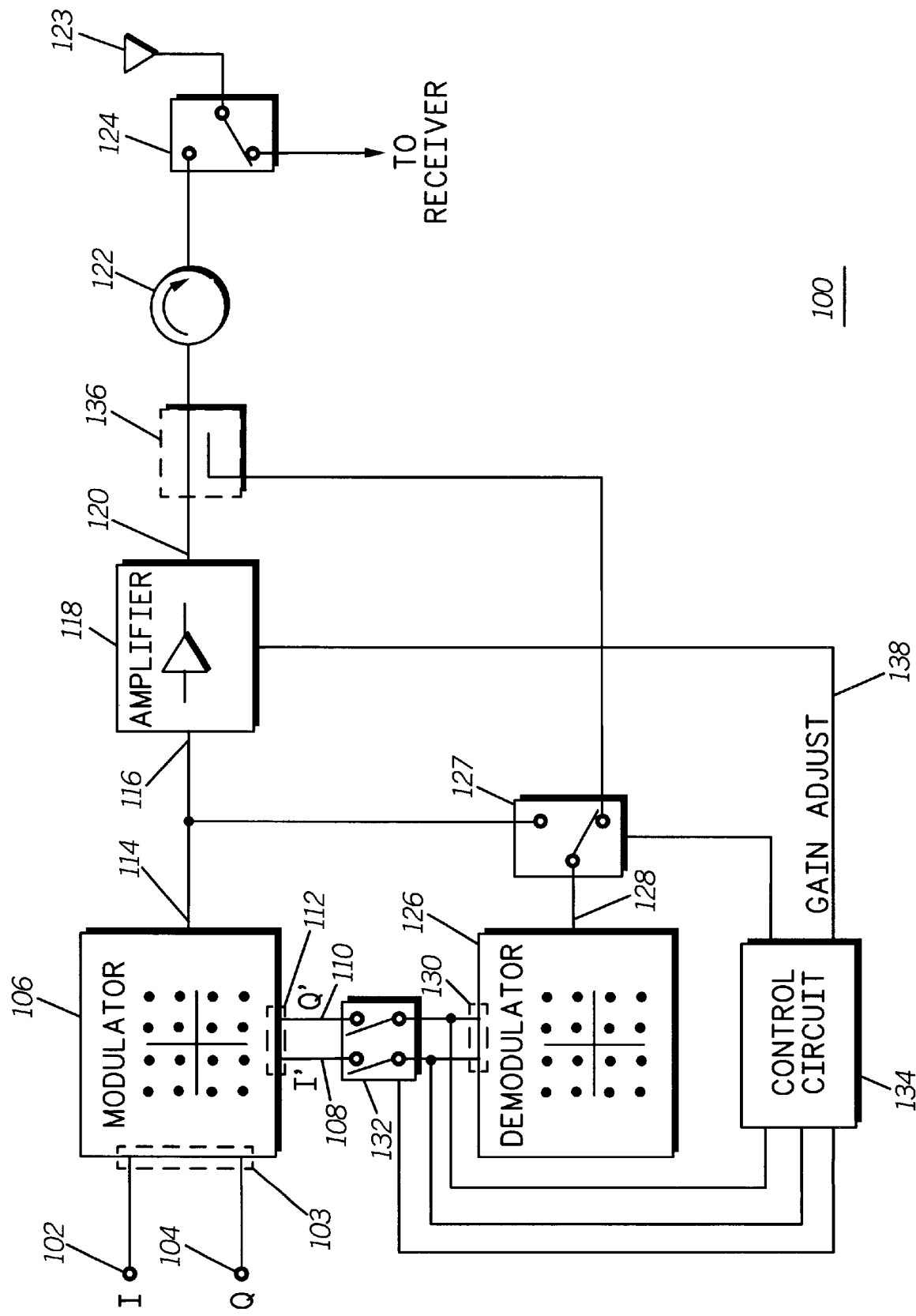

APPARATUS AND METHOD FOR TUNING THE GAIN OF A TRANSMITTER UTILIZING CARTESIAN FEEDBACK

TECHNICAL FIELD

This invention relates in general to transmitters, and more particularly to transmitters using cartesian feedback for linearization.

BACKGROUND

Wireless communications, such as cellular telephony, have gained widespread acceptance in the personal communications marketplace. More recently, digital communications methods used in personal communications systems have proven useful as well. Digital systems offer superior performance in the presence of noise, and permit the implementation of time division schemes, allowing for more efficient use of available frequency spectrum.

Among the various digital communications systems, quadrature amplitude modulation (QAM) and π/4 quadrature phase shift keying (QPSK) have proven to be particularly useful. Many such systems employ what is referred to as cartesian, or I-Q modulation. In I-Q modulation, both the inphase and quadrature components of a carrier are varied. Since many of the devices using digital modulation techniques are hand held, battery powered devices, it is desirable to make them as efficient as possible to extend the life of the battery. Modulation schemes utilizing amplitude modulation require linear amplification of signal in the transmitter to prevent distortion and interference of adjacent channels. Linearity and efficiency are conflicting goals for a conventional power amplifier. One technique that has improved linearity over conventional schemes is the use of cartesian feedback, as is known in the art. An exemplary treatment of the topic can be found in an article titled "Transmitter Linearization Using cartesian Feedback For Linear TDMA Modulation", by M. Johansson and T. Mattsson, as published in the proceedings of the 41st IEEE Vehicular Technology Conference, St. Louis, USA, VTC-91, pp 439–444, May 1991.

In designing a cartesian feedback loop, as in any feedback system, the open loop gain is an important parameter. If the gain is too high, the loop will be unstable; if it is too low, not enough corrective effect will be achieved. The gain is typically tuned and set to a desired level when the device is assembled. This is slow, and requires special test instruments to perform. There are at least two significant problems in designing the device so that the gain is at an optimum level. First, since such devices are manufactured in large numbers, and are often sold in consumer markets, the cost of the device is a critical market factor. Therefore, it is desirable to manufacture such devices with as few custom parts as possible. Building the device with "off the shelf" components, however, results in a significant variance in certain parameters, such as gain. Accordingly, care is taken in designing the loop so as to account for such variance from one unit to the next, and assure proper operation despite component value drift during operation. A second problem results from the fact that these communication devices can experience changes in temperature and voltage during operation, resulting in drift of operating parameters. However, through careful engineering, reasonable variation may be accounted for with a robust design. Unfortunately, design robustness necessarily increases product cost in both materials and engineering time.

It is desirable to avoid this cost, if possible, without compromising design performance. One way to achieve this goal is to design the transmitter such that the transmitter can somehow tune the gain of the power amplifier periodically. Therefore there is a need, in a transmitter using cartesian feedback, for a means by which the transmitter can tune the gain of the power amplifier to maintain feedback loop stability and achieve the desired corrective effect of feedback.

BRIEF DESCRIPTION OF THE DRAWING

The Drawing shows a block diagram of an apparatus for a transmitter using cartesian feedback in accordance with the invention.

DETAILED DESCRIPTION OF THE PREFERRED EMBODIMENT

While the specification concludes with claims defining the features of the invention that are regarded as novel, it is believed that the invention will be better understood from a consideration of the following description in conjunction with the drawing figures, in which like reference numerals are carried forward.

Referring now to the Figure, there is shown a schematic diagram of an apparatus for a transmitter 100, using cartesian feedback, in accordance with the invention. Two baseband signals, I and Q, 102 and 104 respectively, are fed to a modulator 106, which sums the I and Q signals with feedback signals I' and Q', 108 and 110 respectively, which are received at a feedback input 112 of the modulator. The modulator receives the I and Q signals at a baseband input 103, and comprises summing junctions so that the I and I' and Q and Q' signals, respectively, are summed prior to modulation of the carrier, in accordance with a conventional I-Q transmitter using cartesian feedback. A description of a conventional I-Q modulator can be found in U.S. Pat. No. 5,420,536 to Faulkner et al; for more detail on I-Q modulation, the reader may peruse U.S. Pat. No. 4,626,803 to Holm. The modulator modulates the in-phase and quadrature components of a carrier with the I and Q baseband signals, respectively, as is well known in the art. In the preferred embodiment, the I and Q baseband signals are generated according to a QAM scheme. More particularly, the QAM scheme used is a quad QAM scheme. By quad QAM it is meant that each I and Q signal are compound signals, each comprising 4 sub signals that are frequency multiplexed together. I' and Q' are derived from cartesian feedback as is described hereinafter. The modulator has an output 114 which is connected to the input 116 of a power amplifier 118 having an adjustable gain, the gain being responsive to a control signal. Generally the signal at the output 114 of the modulator is an analog radio frequency (RF) signal. The power amplifier has an output 120, where an amplified RF signal is present. In the preferred embodiment, the power amplifier output is connected to an isolator 122, as is common in the art. The isolator ensures that the impedance presented to the output of the power amplifier is substantially constant so that the power amplifier's operating point is stable. The signal from the power amplifier passes through the isolator, to an antenna 123. If the transmitter is part of a transceiver, an antenna switch 124 may be present to selectively connect the antenna to either the transmitter, via the output of the power amplifier, or a receiver, as is common in the art.

Thus far, the forward path of the transmitter has been described. To obtain the desired linearization, cartesian feedback is employed by coupling the output 120 of the power amplifier to a demodulator 126 to derive the I' and Q' signals used for linearization. It should be noted that the demodulator used here is a conventional I-Q demodulator. The demodulator provides an output level on both the I' and Q' lines during operation. The invention further provides for a feedback switch 127 disposed between the input 128 of the demodulator and the output 120 of the power amplifier. The feedback switch is also provided with a connection to the input 116 of power amplifier 118.

In practicing the invention, the feedback switch is used to selectively connect or couple the input 128 of the demodulator with either the input 116 of the power amplifier or a sample of the output 120 of the power amplifier. The demodulator processes the RF signal and produces the I' and Q' signals, 108 and 110 respectively, as described above, which are fed back to the feedback input 112 of the modulator. The invention further provides for a loop switch 132 disposed between the output 130 of the demodulator and the feedback input 112 of the modulator for selectively opening and closing an electrical connection between the modulator and the demodulator, according to the practice of the invention, as described hereinbelow. The loop switch thus permits opening and closing the feedback loop. Both the loop switch 132 and the feedback switch 127 are controlled and operated by a control circuit 134 in accordance with the principles of the invention.

When the gain of the power amplifier is to be tuned, the control circuit 134 first sets the antenna switch 124 to the receive mode, if an antenna switch is present, thereby isolating the output of the transmitter from the antenna. The isolator 122 keeps the power amplifier's operating point stable when the antenna is switched to the receiver. Next, the control circuit opens the loop switch 132, and sets the feedback switch 127 to the input 116 of the power amplifier so that the RF signal generated by the modulator is fed directly to the demodulator. Concurrently, or at some time thereafter, a test signal, preferably a fixed signal, is applied to either the I input 102, the Q input 104, or both. By fixed it is meant that the signal is a steady state DC voltage. The test signal may be provided by the control circuit, or by some other source under direction of the control circuit. The demodulator is then connected directly to the input 116 of the power amplifier 118. Accordingly, the demodulator produces I' and Q' which are derived from the test signal. The control circuit quantifies and records the magnitude of I', Q', or both. This magnitude is referred to as the unamplified value since it is derived from the output of the modulator, not the output of the amplifier. In the preferred embodiment the control circuit includes an analog to digital converter, and converts the sensed analog levels of I', Q', or both, into digital values. These digital values are then stored in an electronic memory, such as a RAM, for future reference.

To determine the gain of the power amplifier, the output of the power amplifier must be sampled and quantified. The feedback switch 127 is set so as to couple the output 120 of the power amplifier to the demodulator. This is done through a coupling 136, having a characterized and known attenuation factor. Again the test signal or signals are provided to the modulator, and the I', Q', or both, are again quantified to obtain the amplified value. Knowing the attenuation factor of the coupling, the gain of the power amplifier can then be determined by comparing the amplified value and the unamplified value, thus providing a raw gain figure.

The raw gain is compared to a prescribed range of gain values. In the preferred embodiment, the control circuit 134 comprises a means for comparing the amplified and unamplified values, such as, for example, a microprocessor. If the raw gain is out of the prescribed range, an error value results, being the difference between the raw gain and the closest nominal gain figure. The error value indicates approximately how much, and in what direction the gain needs to be adjusted.

If the gain of the power amplifier needs to be adjusted, the control circuit provides a gain adjust signal on line 138, which is connected to the power amplifier to increase or decrease the gain of the power amplifier as needed. In the preferred embodiment the control circuit comprises a digital to analog converter (D/A) for providing an adjustable DC voltage level on the gain adjust line 138, which controls the bias of the power amplifier. Adjusting the voltage on the gain adjust line changes the operating point of the power amplifier, and hence, changes the gain of the power amplifier. If, after comparing the values obtained by this method, it is determined that the gain needs to be tuned to a different level, the control circuit writes a digital value to the D/A that corresponds to the desired gain level, thereby adjusting the gain of the power amplifier to a prescribed level or range.

To summarize the preferred method of practicing the invention, the steps performed are:

A) applying a fixed baseband signal to the input of the modulator;

B) quantifying the output level of the demodulator, when the demodulator is coupled to the input of the power amplifier, to obtain an unamplified value, while performing step A;

C) quantifying the output level of the demodulator, when the demodulator is coupled to the output of the power amplifier, to obtain an amplified value, while performing step A;

D) comparing the unamplified value with the amplified value to obtain an error value, after performing steps B and C; and E) adjusting the gain of the power amplifier based on the error value, after performing step D. This method may be performed iteratively, by repeatedly quantifying and adjusting until the raw gain is within the prescribed range, or, the control circuit may contain a means for calculating the necessary adjustment so that the method is performed only once. That is, in an iterative scheme, steps A, B, C, D, and E are repeated until the gain is within a prescribed range. In a non-iterative scheme, the adjustment of step E is such that the gain is within the prescribed range after performing step E once.

It is important to note that a transmitter in accordance with the invention offers an advantage particularly to a portable communications device, such as, for example, a cellular phone or an integrated services radio device. To account for changes in temperature, supply voltage, and component variation from nominal values, the transmitter must periodically retune the gain of the power amplifier. Since the invention requires opening the feedback loop, it is not possible to retune the gain while transmitting information. To account for variations, in the preferred embodiment, the gain is tuned upon powering the transmitter for operation. That is, when the radio device incorporating the transmitter is turned on and readied for use. Thereafter, and depending on the particular application, the gain may be retuned according to a predetermined schedule.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An apparatus for tuning a transmitter having a gain and using cartesian feedback, comprising:
   a modulator having a feedback input and an output;
   a power amplifier having a gain, the gain being adjustable and responsive to a control signal, an output, and an input connected to the output of the modulator;
   a demodulator having an input and an output having an output level;
   a loop switch disposed electrically between the output of the demodulator and the feedback input of the modulator for selectively opening and closing an electrical connection between the modulator and the demodulator;
   a feedback switch for selectively connecting the input of the demodulator to either the input or the output of the power amplifier; and
   a control circuit for quantifying the output level of the demodulator and adjusting the gain of the power amplifier to a prescribed level.

2. An apparatus as defined in claim 1, wherein the modulator receives I and a Q baseband signals.

3. An apparatus as defined in claim 1, wherein said control circuit comprises:
   an analog to digital converter coupled to the output of the demodulator for converting the output level to a digital value;
   an electronic memory for storing the digital value;
   means for comparing an unamplified value with an amplified value; and
   a digital to analog converter for providing the control signal for adjusting the gain of the power amplifier.

4. An apparatus as defined in claim 1, further comprising an isolator coupled to the output of the power amplifier.

5. A method of adjusting the gain of a power amplifier in a transmitter using cartesian feedback, the transmitter including a modulator having an output, a baseband input, and a feedback input, a demodulator having an input and an output, the output having an output level, and the power amplifier having a gain and an input, the gain being responsive to a control signal, the method comprising the steps of:
   A) applying a test signal to the input of the modulator;
   B) quantifying the output level of the demodulator, when the demodulator is coupled to the input of the power amplifier, to obtain an unamplified value, while performing step A;
   C) quantifying the output level of the demodulator, when the demodulator is coupled to the output of the power amplifier, to obtain an amplified value, while performing step A;
   D) comparing the unamplified value with the amplified value to obtain an error value, after performing steps B and C; and
   E) adjusting the gain of the power amplifier based on the error value, after performing step D.

6. A method of adjusting the gain of a power amplifier, as defined in claim 5, wherein the transmitter is disposed in a communications device, said method is performed upon powering the transmitter.

7. A method of adjusting the gain of a power amplifier, as defined in claim 5, wherein steps A, B, C, D, and E are repeated until the gain is within a prescribed range.

8. A method of adjusting the gain of a power amplifier, as defined in claim 5, wherein the step of adjusting is performed such that the gain is within a prescribed range.

9. A method of adjusting the gain of a power amplifier, as defined in claim 5, further comprising the step of isolating the output of the power amplifier after before performing step B or step C.

* * * * *